United States Patent [19]
Lee et al.

[11] Patent Number: 5,742,078
[45] Date of Patent: Apr. 21, 1998

[54] INTEGRATED CIRCUIT SRAM CELL LAYOUTS

[75] Inventors: Soo-cheol Lee, Seoul; Jun-eui Song, Kyungki-do; Heon-jong Shin, Seoul, all of Rep. of Korea

[73] Assignee: Samsung Electronics Co., Ltd., Suwon, Rep. of Korea

[21] Appl. No.: 663,326

[22] Filed: Jun. 7, 1996

[30] Foreign Application Priority Data

Aug. 31, 1995 [KR] Rep. of Korea ............... 1995-28487

[51] Int. Cl.$^6$ ............... H01L 27/148; H01L 27/10; H01L 29/76; H01L 27/108
[52] U.S. Cl. ............... 257/202; 257/206; 257/204; 257/390; 257/908; 257/909
[58] Field of Search ............... 257/202, 274, 257/318, 319, 365, 371, 377, 382, 206, 278, 390, 909, 204

[56] References Cited

U.S. PATENT DOCUMENTS

| 5,414,653 | 5/1995 | Onishi et al. | 257/295 |
| 5,517,038 | 5/1996 | Maeda et al. | 257/72 |

*Primary Examiner*—Sara W. Crane
*Assistant Examiner*—Fetsum Abraham
*Attorney, Agent, or Firm*—Myers Bigel Sibley & Sajovec

[57] ABSTRACT

Integrated circuit SRAM cells include a semiconductor substrate having a field region and first, second, third and fourth active regions therein. The first and second active regions each include a horizontal leg and a vertical leg and are mirror images of each other about a vertical axis. The third and fourth active regions each also include a horizontal leg and a vertical leg and are mirror images of each other about a vertical axis. The integrated circuit SRAM cells also include first and second vertically extending gate conductive layers on the semiconductor substrate. The first vertically extending conductive layer extends vertically over the first active region horizontal leg and extends vertically over the third active region horizontal leg. The second vertically extending conductive layer extends vertically over the second active region horizontal leg and extends vertically over the fourth active region horizontal leg. Accordingly, the gate conductive layers are formed perpendicular to the horizontal legs of the active regions, so that the process alignment margin is large in the longitudinal direction of the active regions. A high integration density may thereby be produced.

19 Claims, 11 Drawing Sheets

INTEGRATED CIRCUIT SRAM CELL LAYOUTS

FIELD OF THE INVENTION

The present invention relates to semiconductor devices, and more particularly to SRAM cells.

BACKGROUND OF THE INVENTION

Integrated circuit Static Random Access Memory (SRAM) devices are widely used in electronic systems. Since an SRAM cell generally comprises six transistors, the SRAM cell generally requires more area than a DRAM cell which generally only includes one transistor and one capacitor. Thus, in the SRAM cell, the pitch of the cells should be minimized so as to increase the integration of the devices in an integrated circuit. However, in order to increase the integration of the cells, the cell pattern and the SRAM manufacturing process may become complicated.

An integrated circuit SRAM cell layout was published at the International Electron Devices Meeting (IEDM) in 1985. This SRAM will be briefly described with reference to FIG. 1. According to the SRAM published at the IEDM in 1985, three polysilicon layers (one for forming a gate electrode and the remaining two for interconnection layers) and one metal layer are used to form an SRAM cell with an area of 9.9×14.3 $\mu m^2$. As shown in FIG. 1, the active region pattern 10 and the pattern 12 of the polysilicon layer used for forming the gate electrode are complicated. Also, the design uses a Vss contact between a node contact and a bit-line contact so as to reduce the cell size. Unfortunately, compared with the conventional Vss contact which is formed parallel to the node contact, the shape of active region 10 is further complicated.

As is known, when patterning the SRAM using lithography, patterns such as the gate electrode and active layer are effected by nonlinearities, distortions and other effects. Thus, as shown in FIG. 2, the edges of the pattern formed on the substrate become rounded. As shown in FIG. 2, due to this rounding, the overlapping portion 24 between the polysilicon layer 22 for forming the gate electrode and the active region 20 is reduced, so that the channel length of the transistor formed in overlapping portion 24 is shortened, compared with FIG. 1. As a result, the leakage current of the transistor may increase.

FIG. 4 is a plane view of the conventional SRAM published at the IEDM. As shown in FIG. 4, a polysilicon layer 36 for forming the gate is formed close to the neighboring node contacts A and B. Thus, due to misalignment in the lithography process, a short may occur between the node contacts A and B and the neighboring polysilicon layer 36. Reference numeral 38 represents a part of the bit-line and reference numeral 39 represents an active region. Also, GND represents a ground line, Vcc represents a power supply line, and IL represents a connection line between the contacts.

In order to solve the above problems, an SRAM was published at the ISSCC (International Solid State Circuits Conference) in 1992. The SRAM published by the ISSCC has a cell area of 8.5×12.8 $\mu m^2$ and includes one polysilicon layer and two metal layers. One of the metal layers determines the overall layout size of the SRAM. As shown in FIG. 3, the metal layer forms a word-line 32 and a Vcc line 30 in the horizontal direction and a connection line 34 between the contacts in the vertical direction. The cell size is determined by the size of each line and the space between the lines. Since the SRAM cell published by the ISSCC in 1992 uses three layers, which is one less than the SRAM published at the IEDM in 1985, this layout is also relatively simple to fabricate.

Notwithstanding the above improvements, the state of the art continues to desire much smaller SRAM cell layouts for high density integration.

SUMMARY OF THE INVENTION

It is therefore an object of the present invention to provide integrated circuit SRAM cells having compact cell layouts.

It is another object of the present invention to provide integrated circuit SRAM cell layouts which can employ a reduced number of conductive interconnection patterns.

These and other objects are provided, according to the present invention, by integrated circuit SRAM cells which include a semiconductor substrate having a field region and first, second, third and fourth active regions therein. The first and second active regions each include a horizontal leg and a vertical leg and are mirror images of each other about a vertical axis. The third and fourth active regions each also include a horizontal leg and a vertical leg and are mirror images of each other about a vertical axis. It will be understood that as used herein, the terms "horizontal" and "vertical" (or "longitudinal") denote orthogonal axes, and should not be limited to a fixed orientation.

The integrated circuit SRAM cells also include first and second vertically extending gate conductive layers on the semiconductor substrate. The first vertically extending conductive layer extends vertically over the first active region horizontal leg and extends vertically over the third active region horizontal leg. The second vertically extending conductive layer extends vertically over the second active region horizontal leg and extends vertically over the fourth active region horizontal leg. Accordingly, the gate conductive layers are formed perpendicular to the horizontal legs of the active regions, so that the process alignment margin is large in the longitudinal direction of the active regions. A high integration density may thereby be produced.

According to other aspects of the invention, the first vertically extending gate conductive layer also extends horizontally to the end of the second active region horizontal leg. The second vertically extending gate conductive layer also extends horizontally to the vertex of the third active region horizontal and vertical legs. The integrated circuit SRAM cell also includes a horizontally extending word line. The word line and the first and second vertically extending gate conductive layers are all formed from a single conductive layer, such as a single polysilicon layer.

Integrated circuit SRAM cells according to the invention also include first and second vertically extending interconnection lines. The first vertically extending interconnection line connects the end of the first active region horizontal leg to the vertex of the third active region horizontal and vertical legs. The second vertically extending interconnection line connects the end of the second active region horizontal leg with the vertex of the fourth active region horizontal and vertical legs. A U-shaped Vss line also connects the end of the third active region horizontal leg to the end of the fourth active region horizontal leg. The U-shaped Vss line includes two vertically extending legs, a respective one of which extends from a respective end of the third active region horizontal leg and a respective end of the fourth active region horizontal leg. The horizontally extending base region connects the two vertically extending legs. Preferably, the first and second vertically extending interconnection lines and the U-shaped Vss line are all formed from a single conductive layer, preferably a single polysilicon layer.

Integrated circuit SRAM cells according to the invention also include first and second vertically extending bit lines and second vertically extending Vcc lines. The first vertically extending Vcc line is connected to the end of the first active region vertical leg. The second vertically extending Vcc line is connected to the end of the second active region vertical leg. The first vertically extending bit line is connected to the vertical leg of the third active region, and the second vertically extending bit line is connected to the vertical leg of the fourth active region. The first and second vertically extending bit lines and the first and second vertically extending Vcc lines are preferably all formed from a single conductive layer which is preferably a single metal layer.

Accordingly, cells with simple layouts can be fabricated using two polysilicon layers and one metal layer. Also, the gate conductive layers are formed vertically with respect to the horizontal regions of each active region, thereby increasing the lithography misalignment margin in the horizontal direction. As a result, the interval between lines can be reduced, thereby increasing the integration density of the SRAM cell.

Integrated circuit SRAM cells according to the invention may also be described by their unique patterns of conductive layers. The conductive patterns include first and second Y-shaped gate conductors on a semiconductor substrate. The Y-shaped gate conductors are nested within one another. Y-shaped gate conductors include vertically extending spaced apart main body portions, horizontal arm portions, a respective one of which extends from one of the main body portions towards the other of the main body portions, and vertical arm portions, a respective one of which extends from the end of the respective horizontal arm portion away from the other horizontal arm portion. The conductive pattern also includes a horizontally extending word line in the semiconductor substrate. The first and second Y-shaped conductors and the horizontally extending word line are preferably all formed from a first conductive layer.

The conductive patterns also preferably include first and second vertically extending interconnection lines, located between the vertically extending spaced apart main body portions of the Y-shaped gate conductors, and the horizontally extending Vss conductor which overlies the horizontally extending word line. The first and second vertically extending interconnection lines and the horizontally extending Vss conductor are preferably all formed from a second conductive layer.

Finally, the conductive patterns may also include first and second vertically extending bit lines, a respective one of which overlies a respective one of the vertically extending interconnection lines, and first and second vertically extending Vcc lines, located outside of the first and second vertically extending bit lines. Preferably, the first and second bit lines and the first and second Vcc lines are all formed from a third conductive layer. Also preferably, the first and second conductive layers are first and second polysilicon layers, and the third conductive layer is a metal layer. Accordingly, a compact, three-level interconnection pattern for an SRAM cell is thereby provided.

DETAILED DESCRIPTION OF PREFERRED EMBODIMENTS

Figure 1:
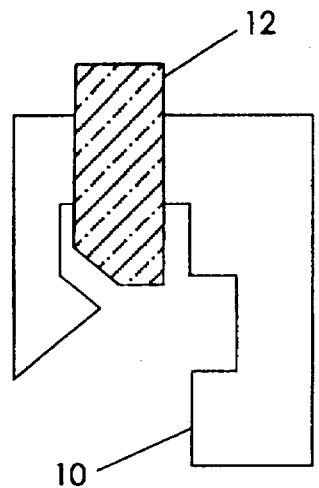
FIGS. 1 to 3 are schematic diagrams of a conventional SRAM cell.
Figure 2:
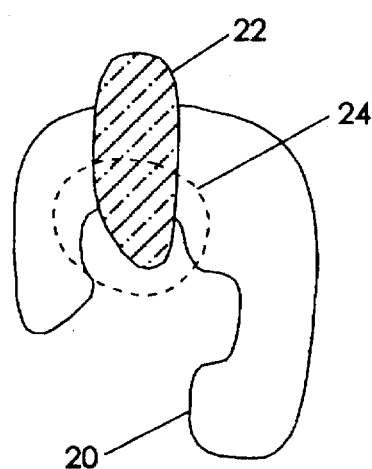
Figure 3:
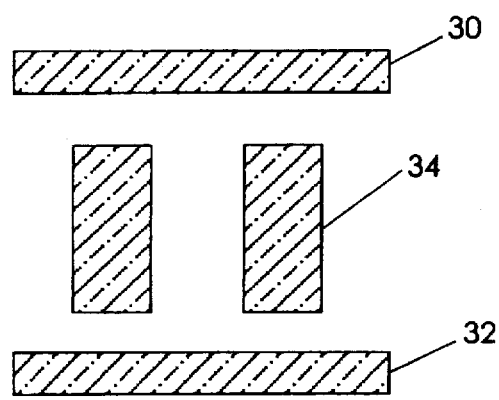
Figure 4:
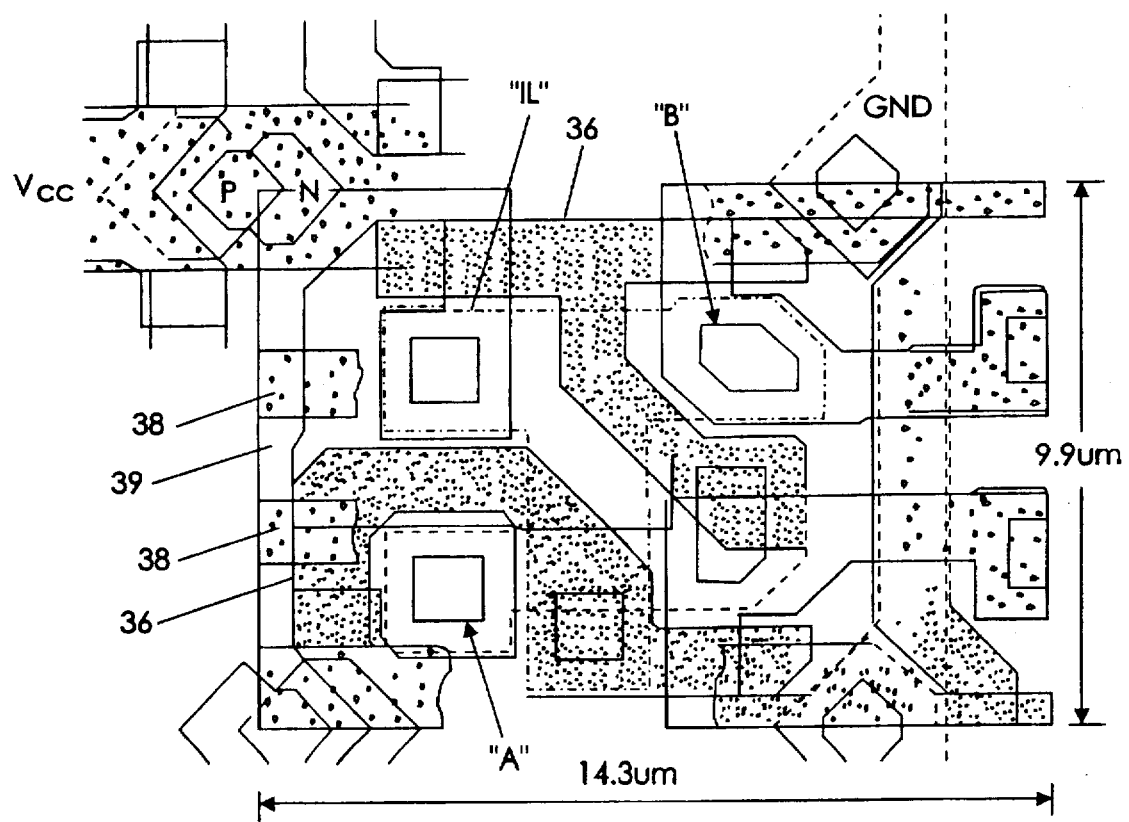
FIG. 4 is a plane view of a conventional SRAM cell.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. Moreover, the terms "first conductivity type" and "second conductivity type" refer to opposite conductivity types such as P- or N-type, however, each embodiment described and illustrated herein includes its complementary embodiment as well.

SRAM cells according to the invention include gate conductive layers, interconnection lines, a word-line, bit-lines, a Vss line and Vcc lines on a semiconductor substrate which is divided into field and active regions. The active regions include first, second, third and fourth active regions. The active regions are L-shaped, and pairs of active regions are mirror images. Vertically extending gate conductive layers extend orthogonal to the horizontal regions of the active regions.

Preferably, the gate conductive layers include first and second gate conductive layers, which are simultaneously formed with the word-line using a single material layer. The material layer is preferably a first polysilicon layer. The interconnection lines and Vss line are simultaneously formed from a second polysilicon layer. Also, the bit-lines and Vcc lines are simultaneously formed from a metal layer.

Pull-up transistors are formed at the center of the horizontal regions of the first and second active regions, and P-type nodes are formed at the ends of the horizontal regions, in which contacts are formed. Also, Vcc contacts are formed at the ends of the vertical regions of the first and second active regions.

Pull-down transistors are fabricated at the center of the horizontal regions of the third and fourth active regions. N-type nodes are formed in the vertex regions where the horizontal and vertical regions join each other, and contacts are formed in the nodes. Also, Vss contacts are formed at the ends of the horizontal regions. Pass transistors are formed in the vertical regions of the third and fourth active regions, and a word-line is formed across the pass transistors.

The vertically extending gate conductive layers are formed perpendicular to the horizontal regions of the active regions, so that the process margin with respect to misalignment may become large in the longitudinal direction of the active regions. Also, the gate conductive layer becomes the gate electrodes of the pull-up, pull-down and pass transistors.

According to the present invention, cells with a simple layout can be constructed using two polysilicon layers and one metal layer. Also, the gate conductive layers are formed vertically with respect to the horizontal regions of each active region, thereby increasing the misalignment margin in the horizontal direction. As a result, the interval between lines (pitch) can be reduced, thereby increasing the integration density of the SRAM cells.

Figure 5:
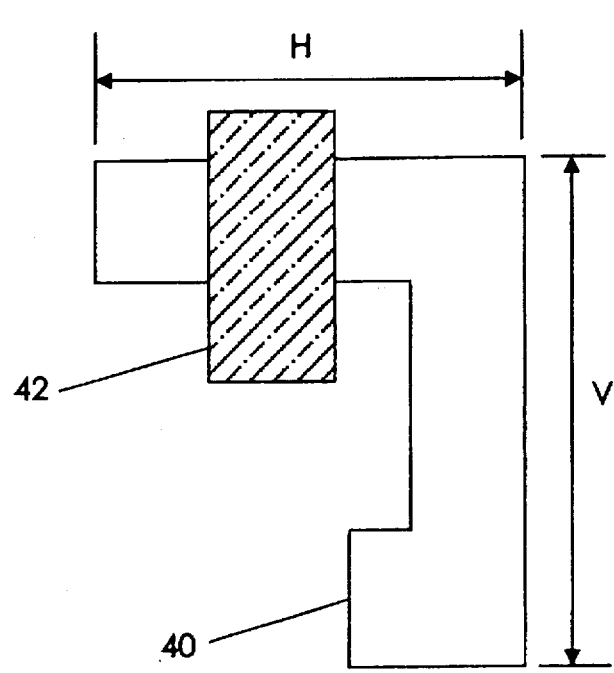
FIGS. 5 and 6 are schematic diagrams of the active region of an SRAM cell according to the present invention.
Figure 6:
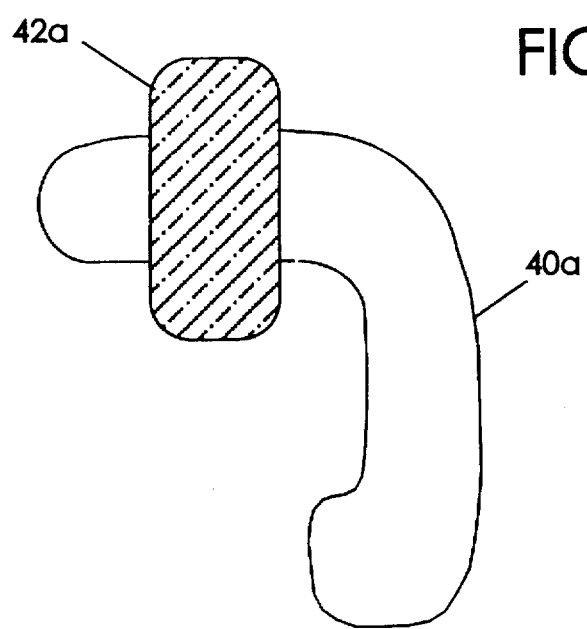

The difference between a conventional SRAM cell and SRAM cells of the present invention will be described with reference to FIGS. 5 and 6. FIG. 5 schematically shows an active region 40 and a gate conductive layer 42 of an SRAM cell according to the present invention. Active region 40 has a horizontal region H and a vertical region V which cross at a right angle. Gate conductive layer 42 is formed on, and perpendicular to, horizontal region H of active region 40. The misalignment margin is relatively small in horizontal region H of active region 40 and relatively large in vertical region V thereof, so that high density integration of the cell can be achieved. Also, as shown in FIG. 6, an active region 40a and a gate conductive layer 42a formed on the semiconductor substrate after the lithography process is not influenced by nonlinearities, distortions, or other effects, compared with the intended layout of FIG. 5.

Figure 7:
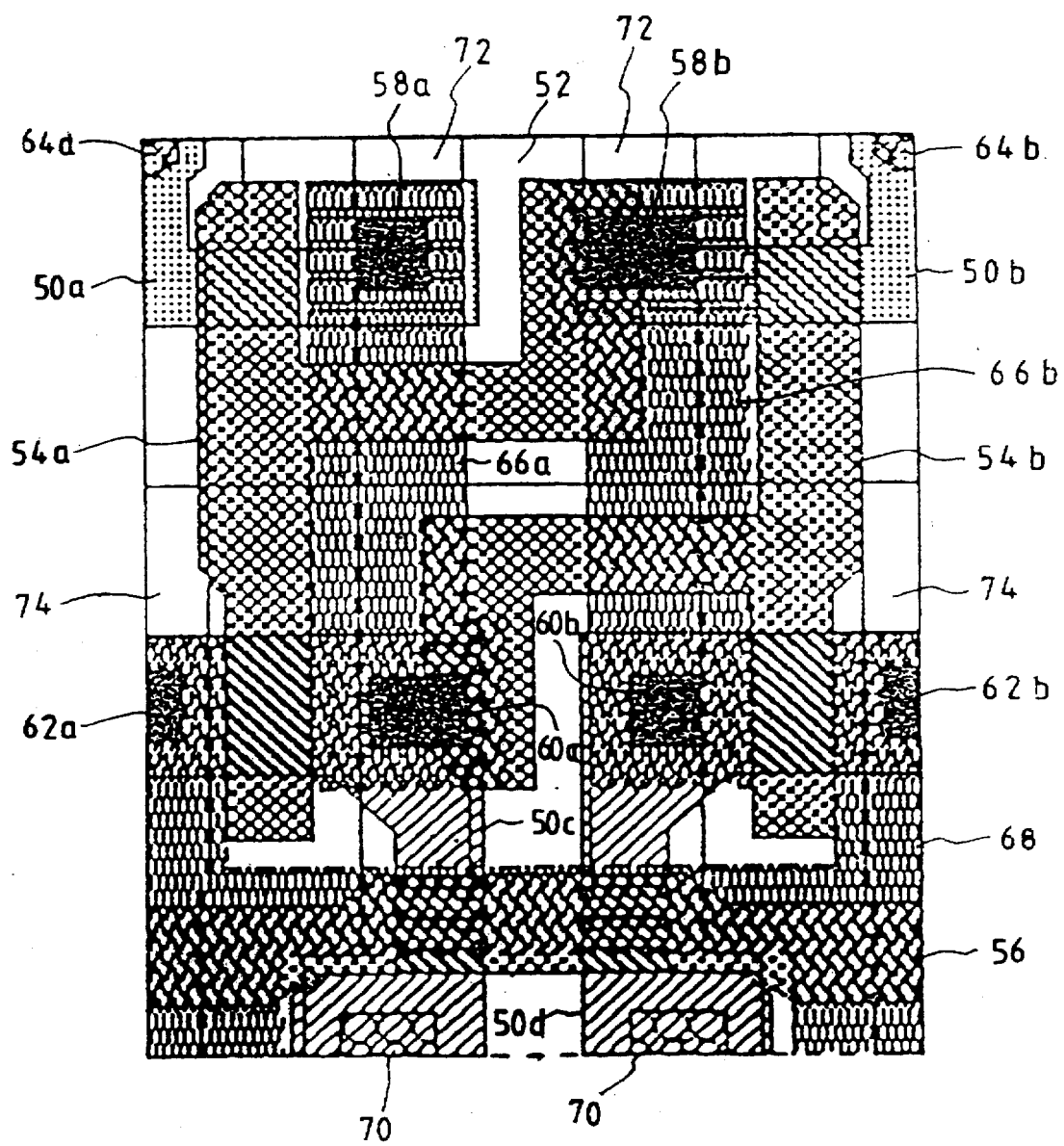
FIG. 7 is a plane view of an SRAM cell according to a first preferred embodiment of the present invention.

An SRAM according to a first preferred embodiment of the present invention will now be described in detail. FIG. 7 is a plane view of an SRAM cell according to a first preferred embodiment of the present invention. The SRAM cell comprises four active regions 50a, 50b, 50c and 50d, a field region 52, first and second gate conductive layers 54a and 54b which connect the four active regions to each other, a word-line 56, bit-lines 72, first and second interconnection lines 66a and 66b, Vcc lines 74 and a Vss line 68.

In detail, four active regions 50a, 50b, 50c and 50d are symmetrically arranged in the upper and lower portions of the cell. Here, first active region 50a, having an L-like shape, is formed at the left of an N well on the semiconductor substrate. Second active region 50b, which is the mirror image of first active region 50a, is formed at the right of the N well, at a predetermined interval. The first and second active regions each include a horizontal leg and a vertical leg. Third active region 50c, having a shape obtained by rotating L-like shape in a 180-degree arc, is formed at the left of a P well, and fourth active region 50d which is the mirror image of third active region 50c is formed at the right of the P well. The third and fourth active regions each include a horizontal leg and a vertical leg. Pull-down transistors are formed in the horizontal regions of the third and fourth active regions 50c and 50d, and pass transistors are formed in the vertical regions thereof.

First and second vertically extending gate conductive layers 54a and 54b function as a gate electrode of the transistors formed in first, second, third and fourth active regions 50a, 50b, 50c and 50d, and as a line for connecting each transistor formed in first, second, third and fourth active regions 50a, 50b, 50c and 50d. First gate conductive layer 54a extends vertically over the horizontal regions of first and third active regions 50a and 50c, and extends horizontally to connect with the end of the horizontal region of second active region 50b. Second gate conductive layer 54b extends vertically over the horizontal regions of second and fourth active regions 50b and 50d, and extends horizontally to the vertex of the third active region horizontal and vertical legs. Word-line 56 is simultaneously formed with the first and second gate conductive layers 54a and 54b. Word-line 56 extends horizontally across the vertical regions of third and fourth active regions 50c and 50d.

First vertically extending interconnection line 66a connects contacts 58a and 60a which are formed in first and third active regions 50a and 50c. In other words, the first vertically extending interconnection line connects the end of the first active region horizontal leg to the vertex of the third active region horizontal and vertical legs. Second vertically extending interconnection line 66b connects contacts 58b and 60b which are formed in second and fourth active regions 50b and 50d. In other words, the second vertically extending interconnection line connects the end of the second active region horizontal leg with the vertex of the fourth active region horizontal and vertical legs.

U-shaped Vss line 68 connects Vss contacts 62a and 62b formed on both sides of third and fourth active regions 50c and 50d. In other words, Vss line 68 connects the end of the third active region horizontal leg to the end of the fourth active region horizontal leg. The Vss line includes two vertically extending legs, a respective one of which extends from a respective end of said third active region horizontal leg and said fourth active region horizontal leg, and a horizontally extending base region which connects the two vertically extending legs.

Vertically extending bit-lines 72 are formed together with vertically extending Vcc lines 74. Bit-lines 72 cross the center of the semiconductor device in the longitudinal direction and connects to bit-line contacts 70. Vcc lines 74 are formed on the left and right sides of the cell in the longitudinal direction. In other words, the first Vcc line is connected to the end of the first active region vertical leg and the second Vcc line is connected to the end of the second active region vertical leg. The first vertically extending bit line is connected to the vertical leg of the third active region, and the second vertically extending bit line is connected to the vertical leg of the fourth active region.

An SRAM of a first preferred embodiment of the present invention, which has the above structure, will be described in detail according to its fabrication steps. FIGS. 8 to 13 are plane views showing an SRAM cell according to a first preferred embodiment of the present invention, during intermediate fabrication steps. Here, the diagram represented by (a) in each figure shows the lines formed only at the corresponding step, and the diagram represented by (b) in each figure also shows all lines formed during the previous steps.

Figure 8A:
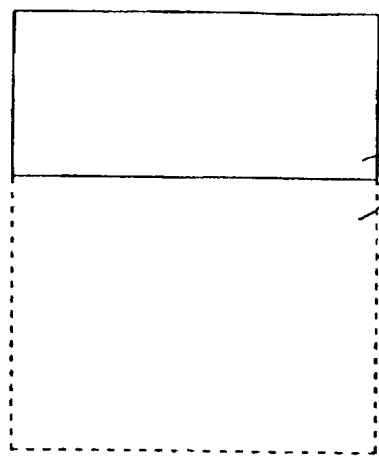
FIGS. 8 to 13 are plane views showing fabrication steps for an SRAM cell according to the first preferred embodiment of the present invention.
Figure 8B:
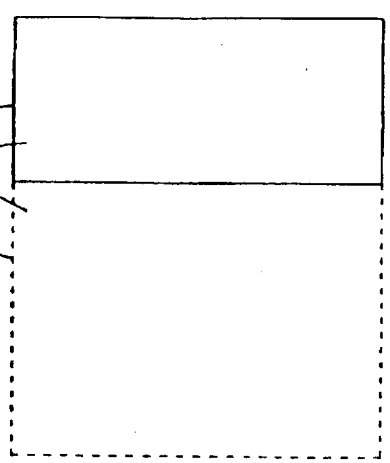

FIG. 8 shows a semiconductor substrate having an N well 78 and a P well 80. N well 78 and P well 80 are formed in the upper and lower portions of the semiconductor substrate, respectively. Also, reference numeral 82 represents a field region.

Figure 9A:
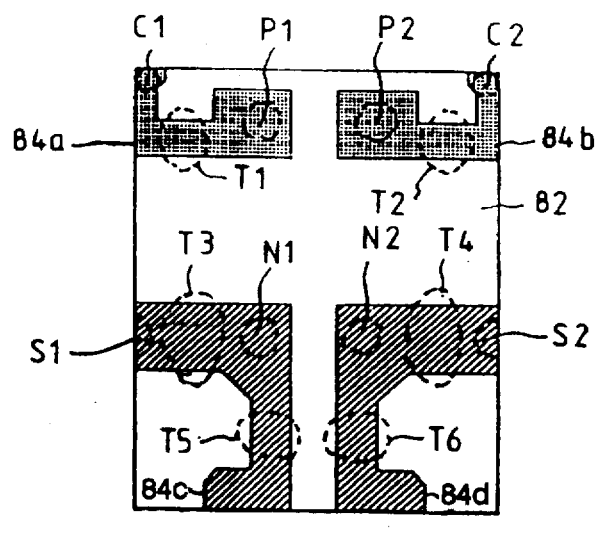
Figure 9B:
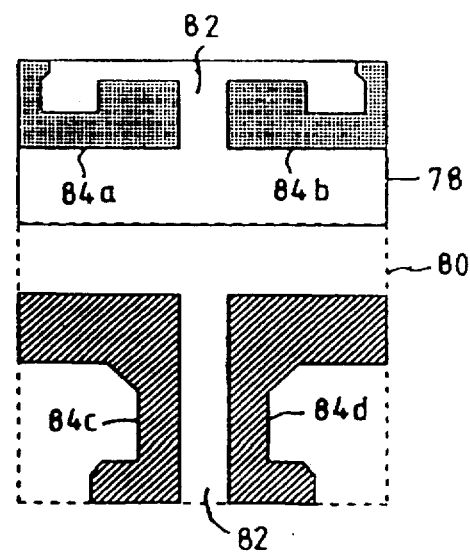

FIG. 9 shows active regions 84a, 84b, 84c and 84d. In detail, third active region 84c of N-type impurities to form an NMOS transistor in P well 80, having a shape obtained by rotating L-like shape in a 180-degree arc, is formed at the left of P well 80. Third active region 84c comprises a first pull-down transistor formation region T3 formed in the horizontal region of P well 80, a first pass transistor formation region T5 formed in the vertical region of P well 80, a first N-type node N1 formed in the vertex region, where first pull-down transistor formation region T3 and first pass transistor formation region T5 join each other, and a first Vss contact region S1 formed at the left end of first pull-down transistor formation region T3. Fourth active region 84d having a mirror image of third active region 84c, is formed in the right of P well 80. Fourth active region 84d comprises a second pull-down transistor formation region T4 formed in the horizontal region of the P well, a second pass transistor formation region T6 formed in the vertical region of the cell, a second N-type node N2 formed in the vertex region, where second pull-down transistor formation region T4 and second pass transistor formation region T6 join each other, and a second Vss contact region S2 formed at the right end of second pull-down transistor formation region T4. Third and fourth active regions 84c and 84d are separated from each other by a predetermined distance.

First active region 84a of P-type impurities forms a PMOS transistor, having an L-like shape, at the left side of N well 78. First active region 84a includes a first pull-up transistor formation region T1, formed in the horizontal region of N well 78, a first Vcc contact region C1 formed in the vertical region of N well 78 and a first P-type node P1 formed to the right of first pull-up transistor T1. Second active region 84b, which is symmetrical with respect to first active region 84a of N well 78, is formed at the right of N well 78. Second active region 84b comprises a second pull-up transistor formation region T2 formed in the horizontal region of N well 78, a second Vcc contact region C2 formed in the vertical region of N well 78, and a second P-type node P2 formed to the left of second pull-up transistor formation region T2. First and second active regions 84a and 84b, which are respectively formed at the left and right of N well 78, are separated from each other by a predetermined distance.

Figure 10A:
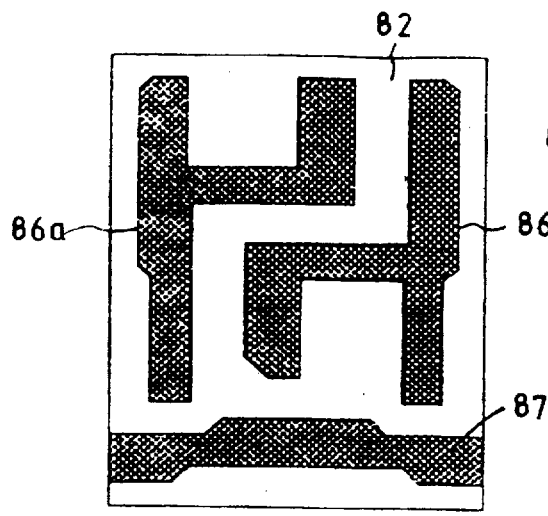
Figure 10B:
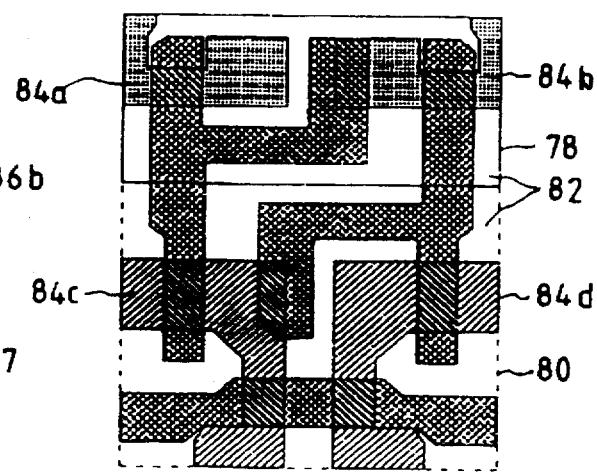

FIG. 10 shows gate conductive layers 86a and 86b, and a word-line 87. In detail, as shown in (a) of FIG. 10, word-line 87 is formed in the lower region of P well 80. Also, word-line 87 is formed across first and second pass transistor formation regions T5 and T6, as shown in (b) of FIG. 10. Gate conductive layers 86a and 86b for forming a bulk transistor are formed in the upper region of the cell, a predetermined distance from word-line 87. First gate conductive layer 86a is formed at the left of the semiconductor substrate with Y-like shape, perpendicular to first pull-down transistor formation region T3 of third active region 84c into which N-type impurities are injected, and also extends perpendicular to first pull-up transistor region T1 of first active region 84a into which P-type impurities are injected. Layer 86a is also connected to second P-type node P2. Second gate conductive layer 86b has a shape which is obtained by rotating first gate conductive layer 86a in a 180-degree arc with respect to the center of the semiconductor substrate in the clockwise direction, and is formed to the right of the semiconductor substrate. Second gate conductive layer 86b is connected to first N-type node N1 and extends perpendicular to second pull-down transistor formation region T4, and also extends perpendicular second pass transistor formation region T2. Stated in other words, the first and second Y-shaped gate conductors are nested within one another, and includes a vertically extending spaced apart main body portions, horizontal arm portions, a respective one of which extends from one of the main body portions towards the other of the main body portions, and vertical arm portions, a respective one of which extends from the end of the respective horizontal arm portion away from the other horizontal arm portion. First and second gate conductive layers 86a and 86b are formed from a first polysilicon layer.

Figure 11A:
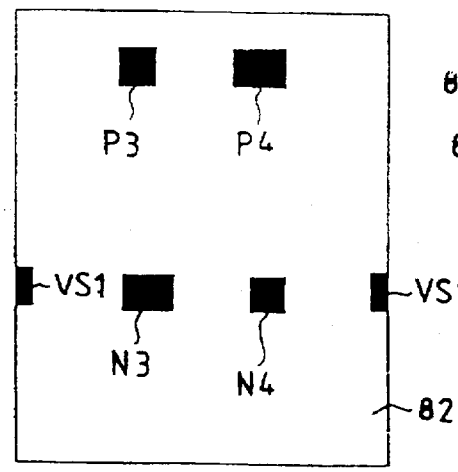
Figure 11B:
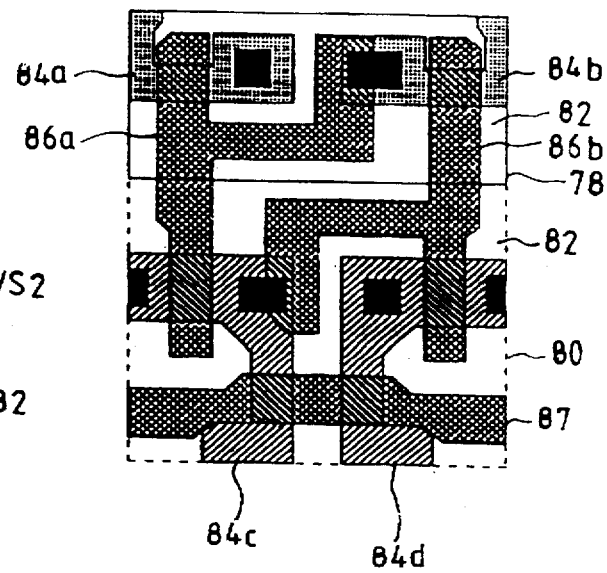

FIG. 11 shows contacts. In detail, referring to (a) of FIG. 11, first and second contacts P3 and P4 are formed at first and second P-type nodes P1 and P2 (see FIG. 9). Third and fourth contacts N3 and N4 are formed in first and second N-type nodes N1 and N2 (see FIG. 9). Vss contacts VS1 and VS2 are formed in first and second Vss regions S1 and S2 (see FIG. 9).

Figure 12A:
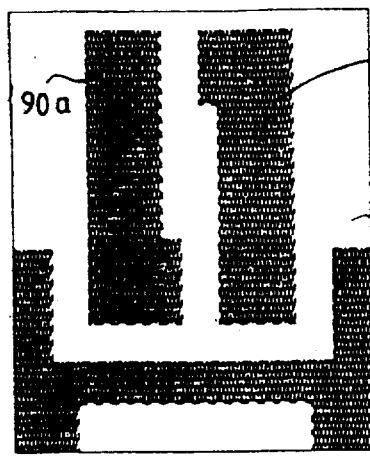
Figure 12B:
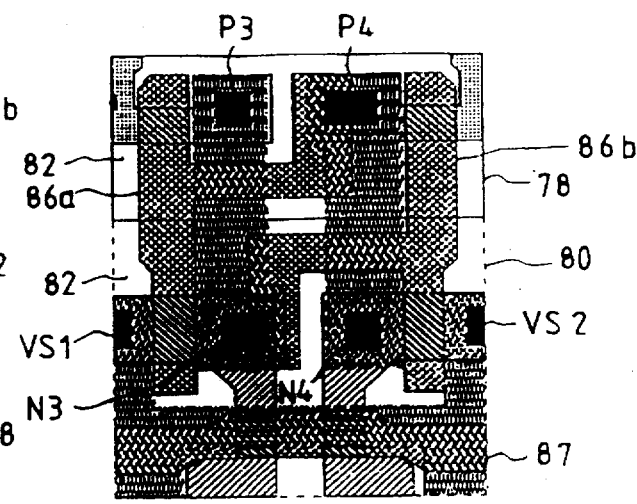

FIG. 12 shows a Vss line 88 and interconnection lines 90a and 90b. In detail, referring to (b) of FIG. 12, there are formed two interconnection lines 90a and 90b along the longitudinal direction of the semiconductor substrate. First interconnection line 90a connects first and third contacts P3 and N3 (see FIG. 11) respectively formed on first P-type and N-type nodes P1 and N1 (see FIG. 9) of first and third active regions 84a and 84c. Second interconnection line 90b connects second and fourth contacts P4 and N4 (see FIG. 11) respectively formed on second P-type and N-type nodes P2 and N2 (see FIG. 9) of second and fourth active regions 84b and 84d. Simultaneously with the formation of first and second interconnection lines 90a and 90b, Vss line 88 with U-like shape (which may also be regarded as an H-like shape), is formed in P well 80. Vss line 88 connects Vss contacts VS1 and VS2 formed in third and fourth active regions 84c and 84d into which N-type impurities are injected. In other words, first and second vertically extending interconnection lines 90a and 90b are located between the vertically extending spaced apart main body portions of the Y-shaped gate conductors 86a and 86b (FIG. 10). Horizontally extending Vss conductor 88 overlies the horizontally extending word line 87.

Vss line 88 is connected to a Vss line of another cell neighboring the above cell (not shown), so that Vss line 88 has low Vss line resistance. First and second interconnection lines 90a and 90b, and Vss contacts VS1 and VS2 are simultaneously formed from the same conductive layer. This conductive layer is preferably a second polysilicon layer.

Figure 13A:
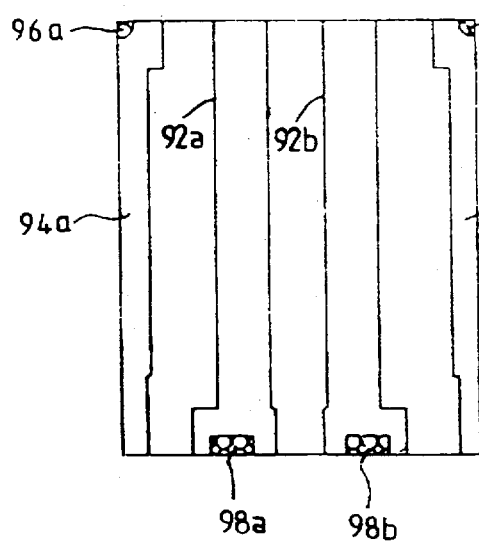
Figure 13B:
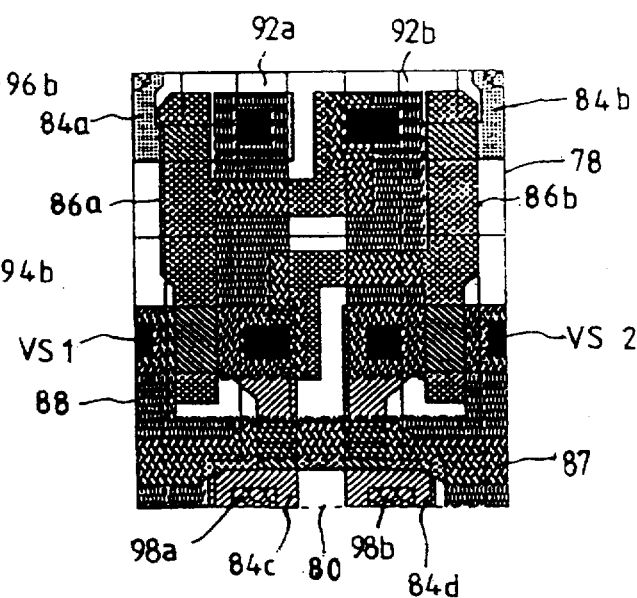

FIG. 13 shows bit-lines 92a and 92b, and Vcc lines 94a and 94b. In detail, as shown in (a) of FIG. 13, bit-lines 92a and 92b are formed in the vertical direction of the semiconductor substrate, spaced a predetermined distance from the center. Vcc lines 94a and 94b are symmetrically formed on the right and left ends of the semiconductor substrate, connecting respective Vcc contacts 96a and 96b. As shown in (b) of FIG. 13, bit-lines 92a and 92b are connected to bit-line contacts 98a and 98b via third and fourth active regions 84c and 84d formed in the lower portion of the P well into which N-type impurities are injected. Stated differently, first and second vertically extending bit lines 92a and 92b respectively, overlie a respective one of the vertically extending interconnection lines 90a, 90b (FIG. 12). First and second vertically extending Vcc lines 94a and 94b respectively, are located outside of the first and second vertically extending bit lines 92a, 92b. Bit-lines 92a and 92b and Vcc lines 94a and 94b are simultaneously formed of the same metal layer.

According to the first preferred embodiment of the present invention, first and second gate conductive layers 86a and 86b with a Y-like shape are connected perpendicular to pull-down transistor formation regions T3 and T4 in the third and fourth active regions. Thus, the margin with respect to the misalignment is relatively small in the horizontal direction of the cell formed on the semiconductor substrate, but relatively large in the vertical direction (see (b) of FIG. 10). Thus, each line interval formed in the cell can become narrow in the vertical direction. Also, since the active region of the cell or the gate conductive layer is structurally simple compared with the conventional cell, each line interval (pitch) can be made relatively narrow in the horizontal direction. As a result, the cell area can be reduced, thereby increasing the integration density in the semiconductor device.

Figure 14:
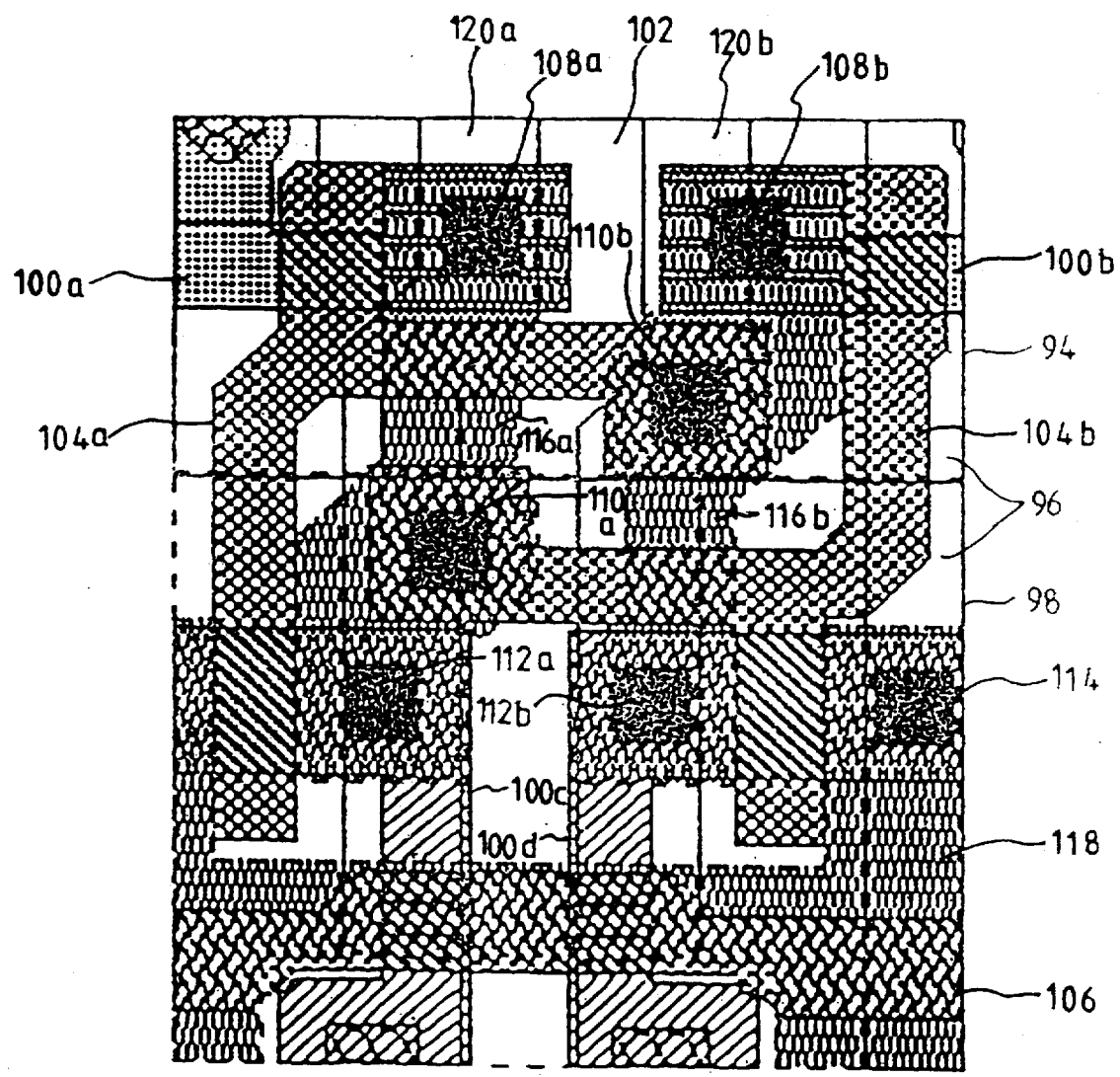
FIG. 14 is a plane view of an SRAM according to a second preferred embodiment of the present invention.

An SRAM according to a second preferred embodiment of the present invention will be described in detail below. FIG. 14 is a plane view of an SRAM according to the second preferred embodiment of the present invention. In general, the second embodiment does not include a gradient part in active regions 100c and 100d, unlike active regions 50c and 50d (see FIG. 7) of the first preferred embodiment of the present invention. Thus, an SRAM cell according to the second preferred embodiment of the present invention may have a larger margin of misalignment in the horizontal direction than that of the first preferred embodiment. Also, unlike the first preferred embodiment, according to the second preferred embodiment, gate conductive layers 104a and 104b, interconnection lines 116a and 116b, and contacts 110a and 110b have slightly different shapes. That is, gate conductive layers 104a and 104b form branches each having a shape obtained by rotating L-like shape in 180-degree arc and L-like shape in field regions 96 of N well 94 and P well 98. Contacts 110a and 110b are formed on the branches of gate conductive layers 104a and 104b. Interconnection lines 116a and 116b, which are also included in the contacts formed on the branches of gate conductive layers 104a and 104b as well as the contacts formed in interconnection lines 90a and 90b (see FIG. 12) of the first preferred embodiment, are formed. The remaining portions other than the above described portions are the same as those of the first preferred embodiment.

FIGS. 15-20 are plane views showing fabrication steps for an SRAM cell according to the second preferred embodiment of the present invention. In the same manner as the first preferred embodiment, there are two plane views in each diagram. The diagram represented by (a) in each figure shows the lines formed only during the corresponding step, and the diagram represented by (b) in each figure shows all lines formed during all previous steps.

Figures 15A, 15B:
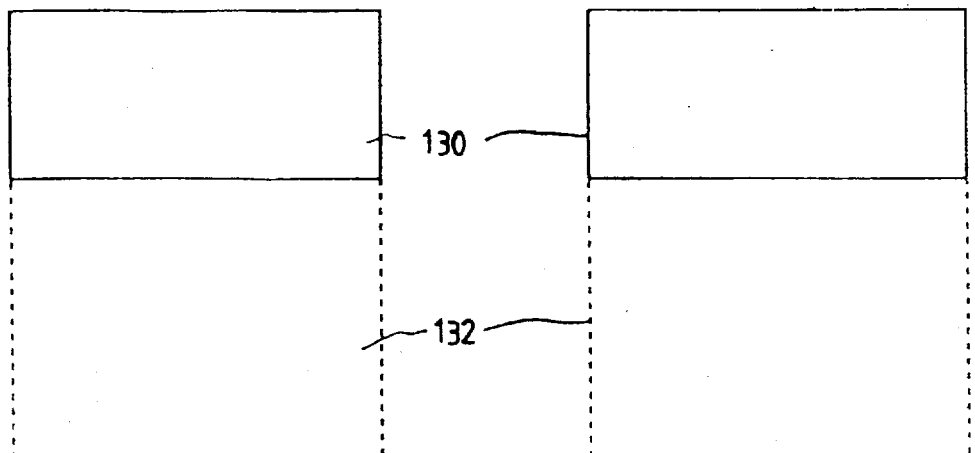
FIGS. 15 to 20 are plane views showing fabrication steps for an SRAM cell according to the second preferred embodiment of the present invention.

FIG. 15 shows an N well 130 and a P well 132 defined on a semiconductor substrate. In detail, N-type and P-type impurities are injected after defining the cell region of the semiconductor substrate, thereby forming N well 130 and P well 132, respectively.

Figures 16A, 16B:
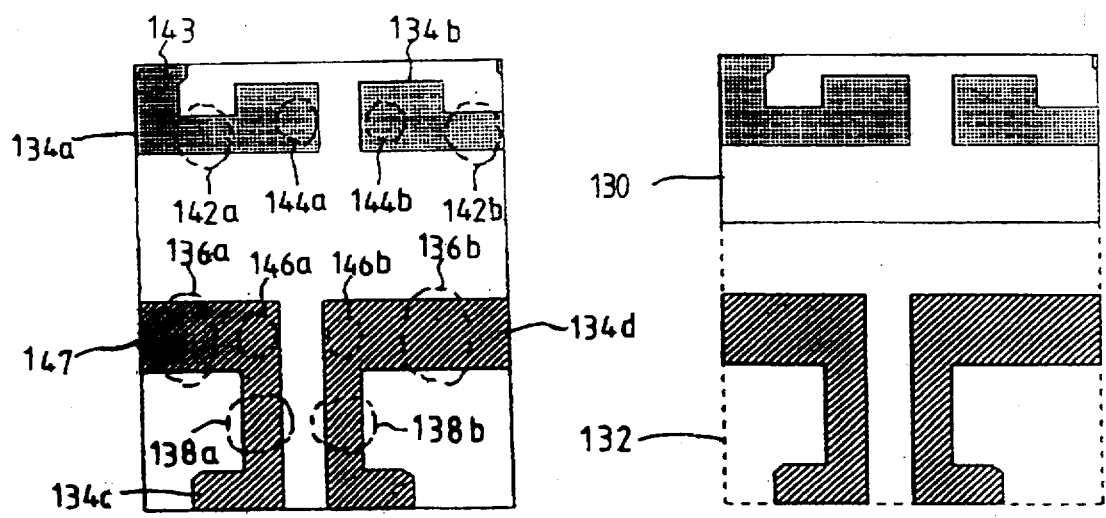

FIG. 16 shows active regions 134a, 134b, 134c and 134d. In detail, first to fourth active regions 134a, 134b, 134c and 134d are formed with the same shape as active regions 84a, 84b, 84c and 84d shown in FIG. 9 of the first preferred embodiment. As shown in FIG. 16, the right end of third active region 134c in which an NMOS transistor is formed, is not aligned in the same line as the right end of first active region 134a in which a PMOS transistor is formed. This asymmetric arrangement may increase the alignment margin when forming the contacts in the active region. The first and second active regions 134a and 134b formed at the left and right of N well 130 of the semiconductor substrate, the first and second pull-up transistor formation regions 142a and 142b formed thereon, the Vcc contact region 143, the first and second pull-down transistor formation regions 136a and 136b formed on third and fourth active regions 134c and 134d, and the first and second pass transistor formation regions 138a and 138b, are the same as those shown in the first preferred embodiment. Also, the first and second P-type nodes 144a and 144b formed on first and second active regions 134a and 134b, the first and second N-type nodes 146a and 146b formed on third and fourth active regions 134c and 134d, and the Vss contact region 147, are the same as those shown in the first preferred embodiment. Thus, a description of these portions will not be repeated.

Figure 17A:
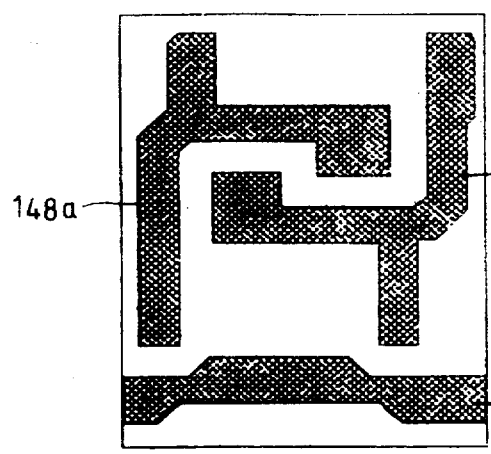
Figure 17B:
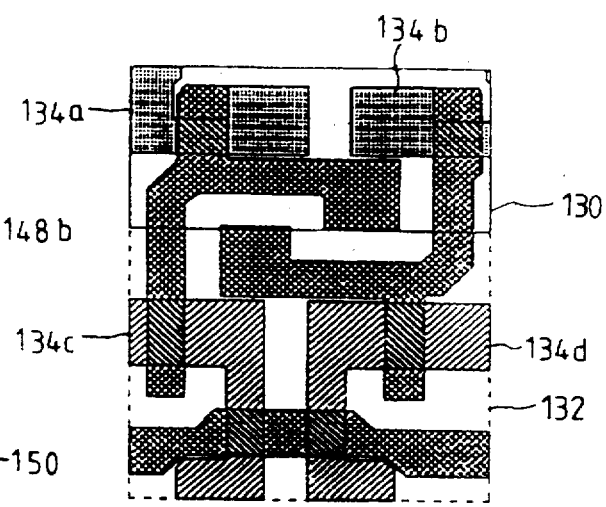

FIG. 17 shows gate conductive layers 148a and 148b, and a word-line 150. In detail, two gate conductive layers 148a and 148b are formed in the same manner as the first preferred embodiment. First gate conductive layer 148a is composed of a gate electrode formation region which is formed in the longitudinal direction across first pull-up transistor formation region 142a (FIG. 16) of first active region 134a, and which is also formed across first pull-down transistor formation region 136a (FIG. 16) of third active region 134c, and a region having a shape obtained by rotating L-like shape in 180-degree arc formed at the right of a field region 152 formed beneath first and second active regions 134a and 134b of the N well formed in the upper portion of the cell. Second gate conductive layer 148b is obtained by rotating first gate conductive layer 148a in a 180-degree arc with respect to the center of the semiconductor substrate. As shown in (b) of FIG. 17, word-line 150 is formed across first and second pass transistor formation regions 138a and 138b (FIG. 16) of third and fourth active regions 134c and 134d. First and second gate conductive layers 148a and 148b, and word-line 150 are preferably formed from a first polysilicon layer.

Figure 18A:
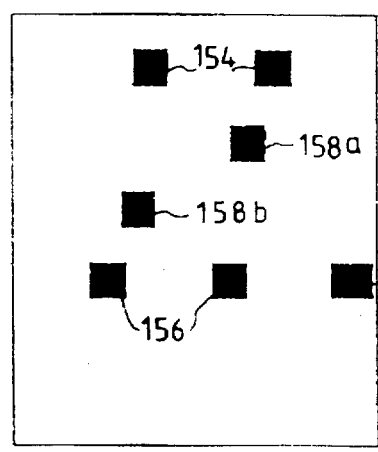
Figure 18B:
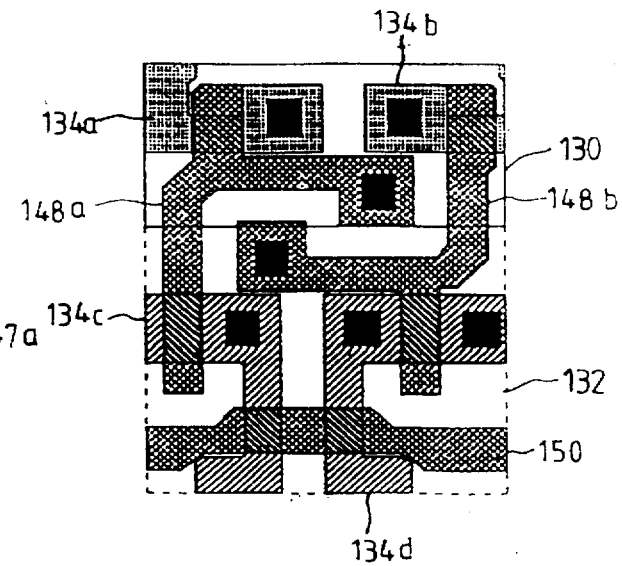

FIG. 18 shows contacts. In detail, first and second contacts 154 and 156 are formed in first and second active regions 134a and 134b, and in third and fourth active regions 134c and 134d, respectively. Third and fourth contacts 158a and 158b are formed at the right end of the shape obtained by rotating L-like shape in a 180-degree arc of first gate conductive layer 148a, and in the symmetrical portion of the second gate conductive layer 148b, that is at the left end of L-like shape, respectively, and a Vss contact 147a formed.

Figure 19A:
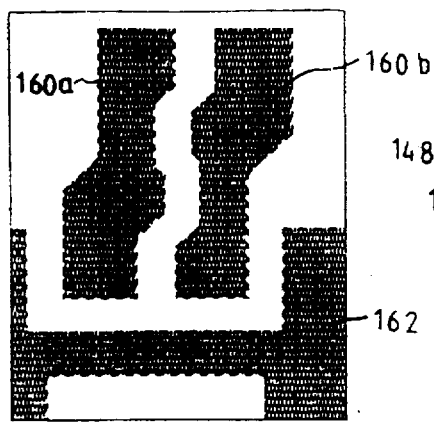
Figure 19B:
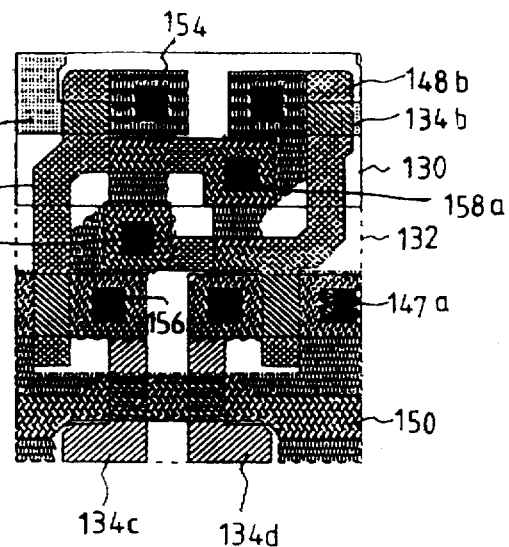

FIG. 19 shows interconnection lines 160a and 160b, and a Vss line 162. In detail, interconnection lines 160a and 160b connect first and second contacts 154 and 156 formed in the P-type and N-type nodes. First interconnection line 160a has a shape obtained by rotating second interconnection line 160b in a 180-degree arc with respect to the center of the semiconductor substrate. Vss line 162 is formed in the same manner as that of the first preferred embodiment. That is, Vss line 162 with U-like or H-like shape is connected to Vss contact 147a at the right of P well 132 formed on the semiconductor substrate. First and second interconnection lines 160a and 160b and Vss line 162, are preferably formed of a second polysilicon layer in the same manner as the first and second conductive layers 148a and 148b.

Figure 20A:
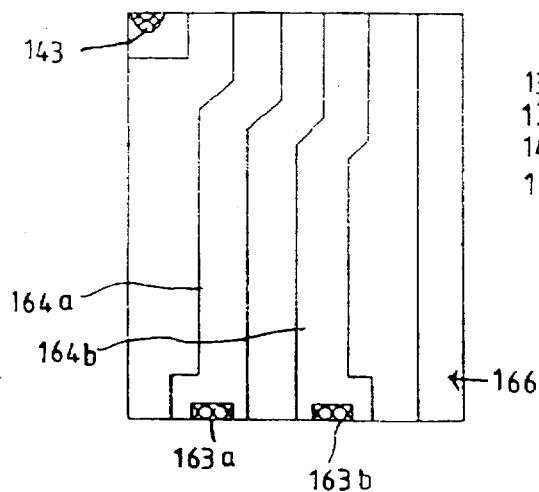
Figure 20B:
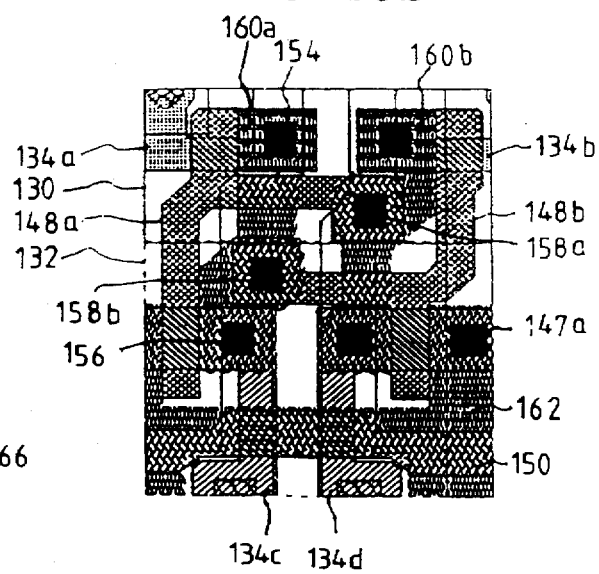

FIG. 20 shows bit-lines 164a and 164b, and Vcc line 166. As shown in (a) of FIG. 20, first bit-line 164a is connected to a bit-line contact 163a via first, second and fourth contacts 154, 156 and 158b. Also, second bit-line 164b is connected to the other bit-line contact 163b via the remaining contact 158a. In this embodiment, the contacts 154, 156, 158a and 158b are not aligned in the horizontal or vertical direction, so that the upper portions of first and second bit-lines 164a and 164b are curved. Vcc lines 166, connected to a Vcc contact 143, are formed along both sides of the cell. First and second bit-lines 164a and 164b, and Vcc lines 166 are simultaneously formed of the same metal layer.

As described above, according to the present invention, the gate conductive layers and word-line are preferably simultaneously formed from the first polysilicon layer. The interconnection lines and Vss line are preferably simultaneously formed from a second polysilicon layer, and the bit-lines and Vcc line are preferably simultaneously formed from one metal layer. Thus, an SRAM cell having simpler structure than that of a conventional SRAM cell can be formed. Also, the gate conductive layers are formed perpendicular to the horizontal region of the active regions, so that alignment tolerances can be increased in the horizontal direction. Thus, the nonlinearities, distortions and other effects which can occur during the SRAM cell fabrication can be reduced, and the interval between each line in the cell can be reduced, thereby increasing the integration density of the SRAM cell.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. An integrated circuit nonvolatile memory cell comprising:

a semiconductor substrate having a field region and first, second, third and fourth active regions therein, said first and second active regions each including a horizontal leg and a vertical leg which define a vertex therebetween, such that said horizontal leg extends horizontally from the vertex and said vertical leg extends vertically from the vertex, said first and second active regions being mirror images of each other about a vertical axis, said third and fourth active regions each including a horizontal leg and a vertical leg which define a vertex therebetween, such that said horizontal leg extends horizontally from the vertex and said vertical leg extends vertically from the vertex, said third and fourth active regions being mirror images of each other about a vertical axis; and first and second vertically extending gate conductive layers on said semiconductor substrate, said first vertically extending conductive layer extending vertically over said first active region horizontal leg and extending vertically over said third active region horizontal leg, and said second vertically extending conductive layer extending vertically over said second active region horizontal leg and extending vertically over said fourth active region horizontal leg.

2. An integrated circuit nonvolatile memory cell according to claim 1 wherein the second active region horizontal leg includes an end, opposite the second active region vertical leg, and wherein said first vertically extending gate conductive layer further extends horizontally to the end of the second active region horizontal leg.

3. An integrated circuit nonvolatile memory cell according to claim 2 wherein said second vertically extending gate conductive layer further extends horizontally to the vertex of the third active region horizontal and vertical legs.

4. An integrated circuit nonvolatile memory cell according to claim 1 further comprising a horizontally extending word line, and wherein said word line and said first and second vertically extending gate conductive layers are all formed from a single conductive layer.

5. An integrated circuit nonvolatile memory cell according to claim 4 wherein said single conductive layer is a single polysilicon layer.

6. An integrated circuit SRAM cell according to claim 1 wherein the first active region horizontal leg includes an end, opposite the first active region vertical leg and wherein the second active region horizontal leg includes an end, opposite the second active region vertical leg, said integrated circuit SRAM cell further comprising first and second vertically extending interconnection lines, the first vertically extending interconnection line connecting the end of the first active region horizontal leg to the vertex of the third active region horizontal and vertical legs, the second vertically extending interconnection line connecting the end of the second active region horizontal leg to the vertex of the fourth active region horizontal and vertical legs.

7. An integrated circuit nonvolatile memory cell according to claim 6 wherein the third active region horizontal leg includes an end, opposite the third active region vertical leg and wherein the fourth active region horizontal leg includes an end, opposite the fourth active region vertical leg, said integrated circuit nonvolatile memory cell further comprising a U-shaped Vss line which connects the end of the third active region horizontal leg to the end of the fourth active region horizontal leg, said U-shaped Vss line including two vertically extending legs, a respective one of which extends from a respective end of said third active region horizontal leg and said fourth active region horizontal leg, and a horizontally extending base region which connects said two vertically extending legs.

8. An integrated circuit nonvolatile memory cell according to claim 7 wherein said first and second vertically extending interconnection lines and said U-shaped Vss line are all formed from a single conductive layer.

9. An integrated circuit nonvolatile memory cell according to claim 8 wherein said single conductive layer is a single polysilicon layer.

10. An integrated circuit nonvolatile memory cell according to claim 1 wherein the first active region vertical leg includes an end, opposite the first active region horizontal leg and wherein the second active region vertical leg includes an end, opposite the second active region horizontal leg, said integrated circuit nonvolatile memory cell further comprising first and second vertically extending bit lines and first and second vertically extending Vcc lines, said first vertically extending Vcc line being connected to the end of the first active region vertical leg, said second vertically extending Vcc line being connected to the end of the second active region vertical leg, said first vertically extending bit line being connected to the vertical leg of the third active region, and said second vertically extending bit line being connected to the vertical leg of the fourth active region.

11. An integrated circuit nonvolatile memory cell according to claim 10 wherein said first and second vertically extending bit lines and said first and second vertically extending Vcc lines are all formed from a single conductive layer.

12. An integrated circuit nonvolatile memory cell according to claim 11 wherein said single conductive layer is a single metal layer.

13. A conductive pattern for an integrated circuit nonvolatile memory cell which is formed in a semiconductor substrate, said conductive pattern comprising:

first and second Y-shaped gate conductors on said semiconductor substrate, said Y-shaped gate conductors being nested within one another, said Y-shaped conductors including vertically extending spaced apart main body portions, horizontal arm portions a respective one of which extends from one of the main body portions towards the other of the main body portions, and vertical arm portions a respective one of which extends from the respective horizontal arm portion away from the other horizontal arm portion; and a horizontally extending word line on said semiconductor substrate.

14. A conductive pattern according to claim 13 wherein said first and second Y-shaped conductors and said horizontally extending word line are all formed from a first conductive layer.

15. A conductive pattern according to claim 14 further comprising first and second vertically extending interconnection lines, located between said vertically extending spaced apart main body portions of said Y-shaped gate conductors, and a horizontally extending Vss conductor which overlies said horizontally extending word line.

16. A conductive pattern according to claim 15 wherein said first and second vertically extending interconnection lines and said horizontally extending Vss conductor are all formed from a second conductive layer.

17. A conductive pattern according to claim 16 further comprising first and second vertically extending bit lines, a respective one of which overlies a respective one of said vertically extending interconnection lines, and first and second vertically extending Vcc lines, located outside of said first and second vertically extending bit lines.

18. A conductive pattern according to claim 15 wherein said first and second bit lines and said first and second Vcc lines are all formed from a third conductive layer.

19. A conductive pattern according to claim 18 wherein said first and second conductive layers are first and second polysilicon layers, and wherein said third conductive layer is a metal layer.

* * * * *